(12) United States Patent
Song

(10) Patent No.: US 8,079,528 B2
(45) Date of Patent: Dec. 20, 2011

(54) INPUT/OUTPUT PADS PLACEMENT FOR A SMART CARD CHIP

(75) Inventor: Ming-Hsiang Song, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1016 days.

(21) Appl. No.: 11/651,870

(22) Filed: Jan. 10, 2007

(65) Prior Publication Data

US 2008/0164324 A1    Jul. 10, 2008

(51) Int. Cl.
*G06K 19/06* (2006.01)
*G06K 19/00* (2006.01)
*G06K 5/00* (2006.01)
*H01L 23/58* (2006.01)
*H01L 23/495* (2006.01)
*H01L 23/52* (2006.01)

(52) U.S. Cl. ........ 235/492; 235/380; 235/487; 235/493; 257/491; 257/679; 257/691

(58) Field of Classification Search .......... 235/487, 235/492, 493, 380; 257/491, 679, 691
See application file for complete search history.

(56) References Cited

U.S. PATENT DOCUMENTS

| | | | | |
|---|---|---|---|---|
| 4,727,246 A * | 2/1988 | Hara et al. | | 235/488 |
| 4,916,662 A * | 4/1990 | Mizuta | | 365/52 |
| 5,285,057 A * | 2/1994 | Murohara | | 235/492 |
| 5,300,765 A * | 4/1994 | Mizuta | | 235/492 |
| 5,426,323 A * | 6/1995 | Reczek et al. | | 257/360 |
| 5,490,117 A * | 2/1996 | Oda et al. | | 365/226 |
| 5,534,686 A * | 7/1996 | Kowalski et al. | | 235/492 |
| 5,932,866 A * | 8/1999 | Terada et al. | | 235/487 |
| 6,025,997 A * | 2/2000 | Huber et al. | | 361/777 |
| 6,151,202 A * | 11/2000 | Mueller et al. | | 361/212 |
| 6,235,553 B1 * | 5/2001 | Kawan | | 438/107 |
| 6,370,029 B1 * | 4/2002 | Kawan | | 361/737 |
| 6,424,029 B1 * | 7/2002 | Giesler | | 257/679 |
| 6,439,464 B1 * | 8/2002 | Fruhauf et al. | | 235/492 |
| 6,479,871 B2 * | 11/2002 | Peters et al. | | 257/355 |
| 6,496,381 B1 * | 12/2002 | Groeger | | 361/761 |
| 6,581,122 B1 * | 6/2003 | Sarat | | 710/301 |
| 6,634,565 B2 * | 10/2003 | Gray | | 235/492 |
| 6,752,321 B1 * | 6/2004 | Leaming | | 235/492 |
| 6,817,534 B2 * | 11/2004 | Gray | | 235/492 |
| 6,945,465 B2 * | 9/2005 | Nishizawa et al. | | 235/492 |
| 7,064,423 B2 * | 6/2006 | Okita et al. | | 257/679 |
| 7,296,754 B2 * | 11/2007 | Nishizawa et al. | | 235/492 |
| 7,323,752 B2 * | 1/2008 | Chu et al. | | 257/360 |
| 7,325,724 B2 * | 2/2008 | Bonalle et al. | | 235/380 |
| 7,411,767 B2 * | 8/2008 | Huang et al. | | 361/56 |
| 7,538,418 B2 * | 5/2009 | Nishizawa et al. | | 257/679 |
| 7,543,757 B2 * | 6/2009 | Nishizawa et al. | | 235/492 |

(Continued)

*Primary Examiner* — Daniel Walsh
(74) *Attorney, Agent, or Firm* — K&L Gates LLP

(57) ABSTRACT

A chip for a smart card including a plurality of electrical contacts for communication of data with a smart card reader is disclosed. In one embodiment, a chip for a smart card includes a core circuit and a plurality of input/output pads corresponding to said set of electrical contacts, wherein said input/output pads are divided into at least a first column and a second column placed immediately adjacent to the first column, such that the first and second columns form a cluster. In another embodiment, eight input/output pads are divided into two columns, placed immediately adjacent to each other. The cluster may be partially surrounded by the core circuit. The chip may further comprise an ESD network, comprising VDD and GND buses for improved ESD protection while reducing the size of the chip.

16 Claims, 5 Drawing Sheets

U.S. PATENT DOCUMENTS

| | | |
|---|---|---|
| 7,552,876 B2 * | 6/2009 | Nishizawa et al. ............ 235/492 |
| 7,768,110 B2 * | 8/2010 | Nishizawa et al. ............ 257/679 |
| 2001/0009505 A1 * | 7/2001 | Nishizawa et al. ............ 361/737 |
| 2001/0011766 A1 * | 8/2001 | Nishizawa et al. ............ 257/685 |
| 2002/0050527 A1 * | 5/2002 | Nishikawa et al. ............ 235/492 |
| 2002/0063313 A1 * | 5/2002 | Lee et al. ....................... 257/659 |
| 2003/0085287 A1 * | 5/2003 | Gray .............................. 235/492 |
| 2003/0112611 A1 * | 6/2003 | Nishizawa et al. ............ 361/763 |
| 2003/0209793 A1 * | 11/2003 | Nishizawa et al. ............ 257/679 |
| 2005/0231921 A1 * | 10/2005 | Noda et al. .................... 361/737 |
| 2005/0252978 A1 * | 11/2005 | Nishizawa et al. ............ 235/492 |
| 2005/0270712 A1 * | 12/2005 | Huang et al. .................... 361/90 |
| 2006/0016869 A1 * | 1/2006 | Bonalle et al. ................. 235/380 |
| 2006/0043491 A1 * | 3/2006 | Lee et al. ....................... 257/355 |
| 2006/0054711 A1 * | 3/2006 | Osako et al. .................. 235/492 |
| 2006/0065933 A1 * | 3/2006 | Chu et al. ...................... 257/355 |
| 2006/0081968 A1 * | 4/2006 | Bai et al. ........................ 257/678 |
| 2006/0208091 A1 * | 9/2006 | Nishizawa et al. ............ 235/492 |
| 2007/0102530 A1 * | 5/2007 | Nishizawa et al. ............ 235/492 |
| 2007/0102799 A1 * | 5/2007 | Nishizawa et al. ............ 257/679 |
| 2007/0138301 A1 * | 6/2007 | Cinkler .......................... 235/492 |
| 2007/0145133 A1 * | 6/2007 | Jolivet .......................... 235/441 |
| 2007/0201174 A1 * | 8/2007 | Hynes et al. .................... 361/56 |
| 2007/0235547 A1 * | 10/2007 | Janke et al. ................... 235/492 |
| 2008/0006704 A1 * | 1/2008 | Kim .............................. 235/492 |
| 2008/0149739 A1 * | 6/2008 | Nishizawa et al. ............ 235/492 |
| 2008/0231328 A1 * | 9/2008 | Leydier et al. ................. 327/105 |
| 2008/0257967 A1 * | 10/2008 | Nishizawa et al. ............ 235/492 |
| 2010/0103570 A1 * | 4/2010 | Song et al. ...................... 361/56 |

* cited by examiner

INPUT/OUTPUT PADS PLACEMENT FOR A SMART CARD CHIP

BACKGROUND

The present invention relates to the field of smart card chips, and particularly to the placement of the input/output pads for chips used in smart cards for improving electrostatic discharge (ESD) performance and reducing the layout area for such chips.

A smart card is a type of plastic card embedded with an integrated circuit chip that may include non-volatile memory storage components and some other specific security logic. Smart card-enhanced systems are wildly used in areas including healthcare, banking, entertainment and transportation.

Smart cards include contact cards, contactless cards and hybrid cards. Contactless cards use a radio frequency (RF) for communications between a card and a card reader. Contact cards and hybrid cards comprise a set of electrical contacts located on the outside of the cards that are to be connected to a card reader, into which they are inserted.

A smart card typically comprises a chip that includes a microprocessor and a memory, such as Random Access Memory (RAM), Read Only Memory (ROM), and Electrically-Erasable Programmable Read Only Memory (EE-PROM), which are accessible through electrical contacts. The contacts provide power, an input/output for serial data communication, a connection for reading the smart card clock signal, a connection for resetting the smart card, and a connection for the programming voltage of the smart card. The size, function, and location of these contacts are dictated by an industry standard ISO 7816-2 and 7816-3. (See also FIG. 1A). This standard allows various manufacturers to create smart cards and devices that are compatible with each other.

The conventional layout of the input and output (I/O) pads of a smart card is shown in FIG. 1B. The main disadvantage of this layout, however, is a need for cross-chip VDD/GND (or VCC/GND in FIG. 1B) bus metal connection to provide an adequate ESD protection network. This cross-chip VDD/GND bus metal connection increases the chip size, and is, therefore, undesirable.

The chips embedded in smart cards are typically made by complementary MOS (CMOS) technology, and need to be protected against ESD damage. As the card is carried around, slid in and out of a wallet, and inserted into a card reader, static charges accumulate on the card. When enough charge has accumulated at a particular point on the card, it will travel to the lowest potential voltage available to it (typically, the ground). On its way from the point of accumulation to a lower potential, the charge, if high enough, may damage the chip. The induced voltage and current of the accumulated charge can be quite large (e.g., 2,000 volts and more or up to 1.3 ampere over a 1.5 kΩ resistor and more) compared to the maximum voltage or current the chip can stand (e.g., a gate oxide of a MOS transistor can be destroyed with a voltage only few volts higher than the regular supply voltage, which is 5V, 3.3V or even lower).

An ESD protection circuit is typically added to a chip at the bond pads, which are connections that allow the chip to connect to outside circuits, electric power supplies, electric grounds, and electronic signals. Such ESD protection circuits must allow a normal operation of the chip such that, during normal operation, it is effectively isolated from the core circuitry of the chip.

A semiconductor device with four alternate layers of p-type and n-type semiconductor material or a PNPN device called a Silicon Controlled Rectifier (SCR) can be one of the most effective devices in an ESD protection circuit in preventing ESD-induced damage. A SCR operates in two modes: a blocking mode and a latch-up mode. In the blocking mode, the SCR blocks a current flow therethrough, such that the ESD protection circuit has no effect on the core circuitry to be protected. Where there is a sufficient regeneration of current flow in the SCR, the latch-up condition is triggered. A latch-up arises from the presence of complementary parasitic bipolar transistor structures, which are typically inherent in CMOS structures. Since they are in close proximity, the complementary bipolar structures can interact electrically to form device structures which behave like PNPN diodes. This enables a large current to flow through the SCR to bypass the core circuitry during an ESD event.

However, whatever mechanism is used as the ESD protection circuit, the conventional chip for a smart card must also include a cross-chip VDD/GND bus metal connections (see FIG. 1B), which increases the chip size.

Desirable in the art of smart card designs are novel designs that provide a space-efficient layout for the input/output pads of chips used in smart cards.

SUMMARY

The present invention relates to the field of smart card chips, and particularly to the placement of the input/output pads for chips used in smart cards for improving electrostatic discharge (ESD) performance and reducing the layout area for such chips. Merely by way of example, the invention has been applied to a chip used in smartcards. However, it would be recognized that the invention has a much broader range of applicability as well.

In a specific embodiment, the invention provides a chip with new input/output pad placement for smart cards. In one embodiment, a chip for a smart card includes a core circuit. The chip further includes a plurality of input/output pads corresponding to said set of electrical contacts, wherein said input/output pads are divided into at least a first column and a second column placed immediately adjacent to the first column, such that the first and second columns form a cluster.

In another embodiment, a method for placing input/output pads for a smartcard chip including a core circuit and a plurality of input/output pads for communication of data with a smart card reader is disclosed. The method includes grouping the plurality of input/output pads into at least a first column and a second column, with each column having an equal number of input/output pads. The method further includes placing the first column and the second column immediately adjacent to each other to form a cluster within the core circuit.

In yet another embodiment, the chip comprises an electrostatic discharge network, composed of at least one VDD bus being electrically connected to said power supply pad and at least one GND bus being electrically connected to said ground pad, said VDD bus and said GND bus placed substantially parallel to said columns of said input/output pads. The VDD buses can be placed on each side of said cluster and said GND bus is placed between said columns, wherein each said input/output pads are connected to at least one GND bus or VDD bus through an electrostatic discharge unit, thereby providing short paths to the ground from each said input/output pads to said GND bus or VDD bus.

One of the advantages of the new placement over the conventional related art is that since there is no need for cross-chip VDD/GND bus connections, the chip size can be reduced by at least three to five percent for customer chips. Another advantage includes that the present invention provides an improved ESD performance. Since the cluster can be put anywhere on the chip, it is easy to integrate with an on-chip voltage regulator as well.

The construction and method of operation of the invention, however, together with additional objects and advantages thereof will be best understood from the following description of specific embodiments when read in connection with the accompanying drawings.

DESCRIPTION

The present invention relates to the field of smart card chips, and particularly to the placement of the input/output pads for chips used in smart cards for improving ESD performance and reducing the layout area for such chips. The following will provide a detailed description of a new placement for the input/output pads for chips used in smart cards.

Figure 1A:
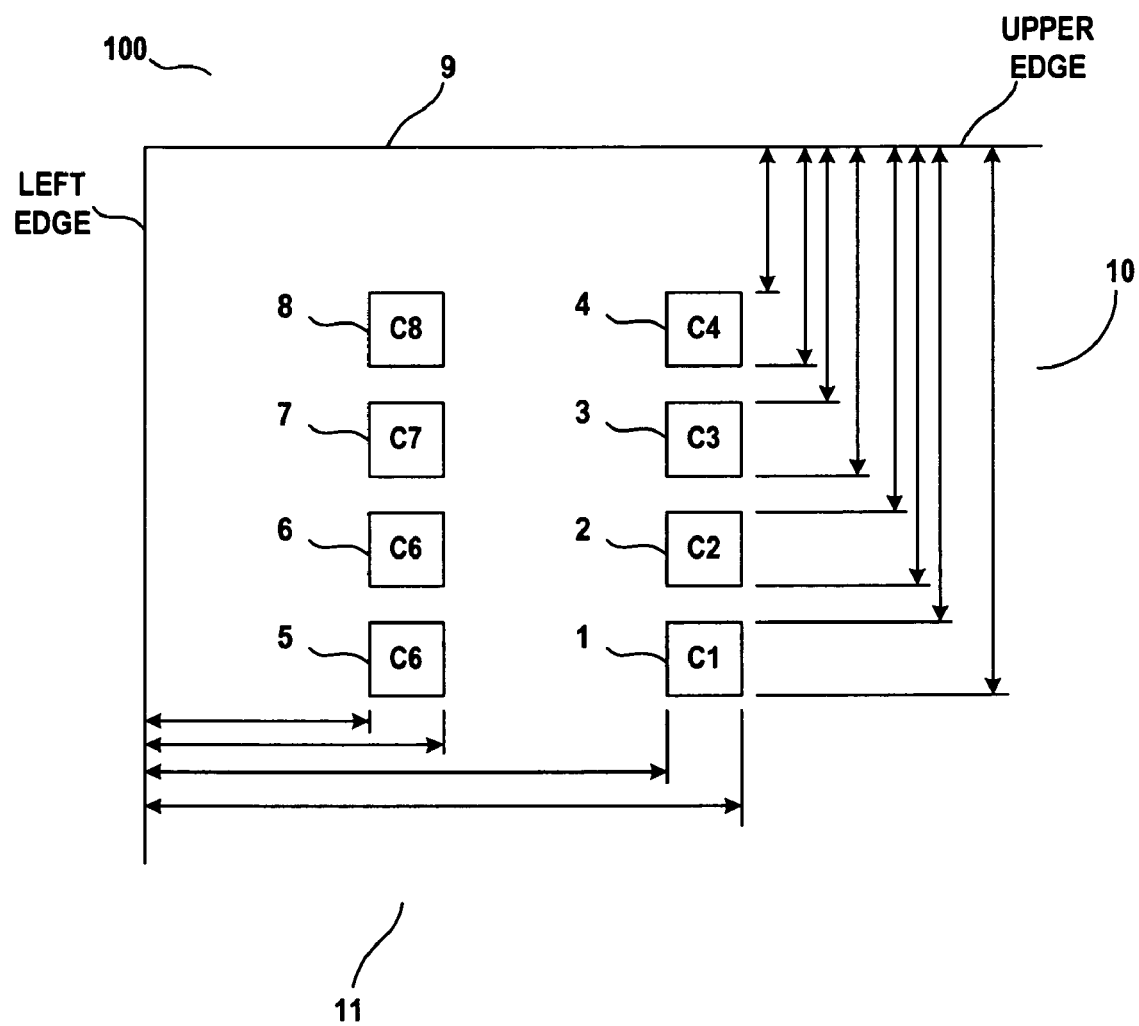
FIG. 1A is a simplified layout diagram for smart card contact points according to ISO standards.

FIG. 1A is a simplified layout diagram for smart card contact points according to ISO standards. As shown in a diagram 100 in FIG. 1A, an ISO standard exists for placement of the electrical contacts 1 to 8 relative to a smart card edge 9. The contacts 1 and 5 are designed to be connected to a power supply and ground. The contact 7 functions as an input/output pad for serial data. The contact 3 functions as a connection for reading the smart card clock signal. The contact 2 functions as a connection for resetting the smart card, and the contact 6 serves as a connection for the programming voltage of the smart card. The placements of the contacts are determined by sets of distances 10 and 11 from the top edge and the left edge of the smart card, respectively. The contacts 4 and 8 are reserved for future use.

Figure 1B:
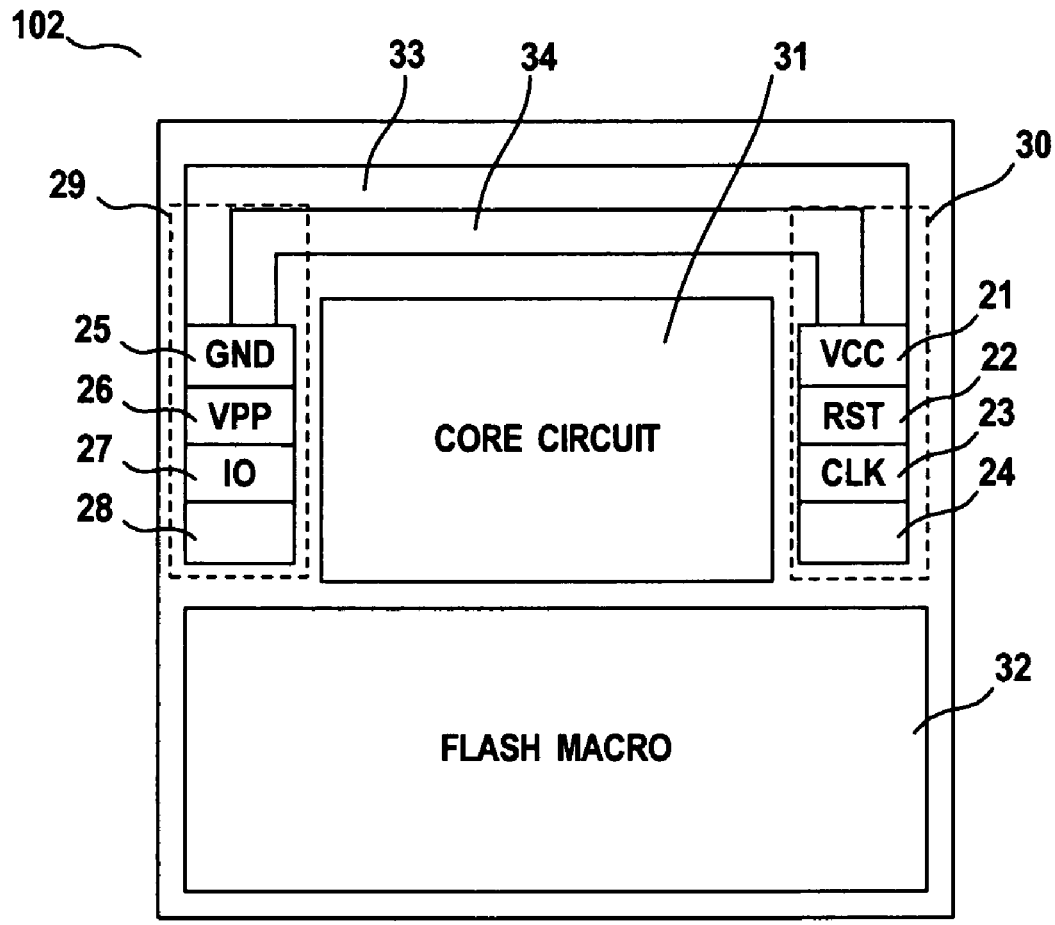
FIG. 1B is a simplified layout diagram for the conventional placement of input/output pads for a smart card chip.

FIG. 1B is a simplified layout diagram for the conventional placement of input/output pads for a smart card chip. The ISO standard for placement of the contacts 1 to 8 shown in FIG. 1A leads to the conventional placement of the input/output pads of smart card chips as shown in FIG. 1B. Traditionally, a chip 102 has input/output pads 21 to 28 on the edge of the chip 102, divided into two columns 29 and 30, and separated by a core circuit 31.

The chip 102 also comprises a memory device 32. Both the core circuit 31 and the memory device 32 are very sensitive to ESD, and therefore the chip 102 must also comprise an adequate ESD protection network constructed by cross-chip VDD/GND bus connections 33 and 34. Such cross-chip VDD/GND bus connections increase the overall chip area and bus resistance significantly.

Figure 2:
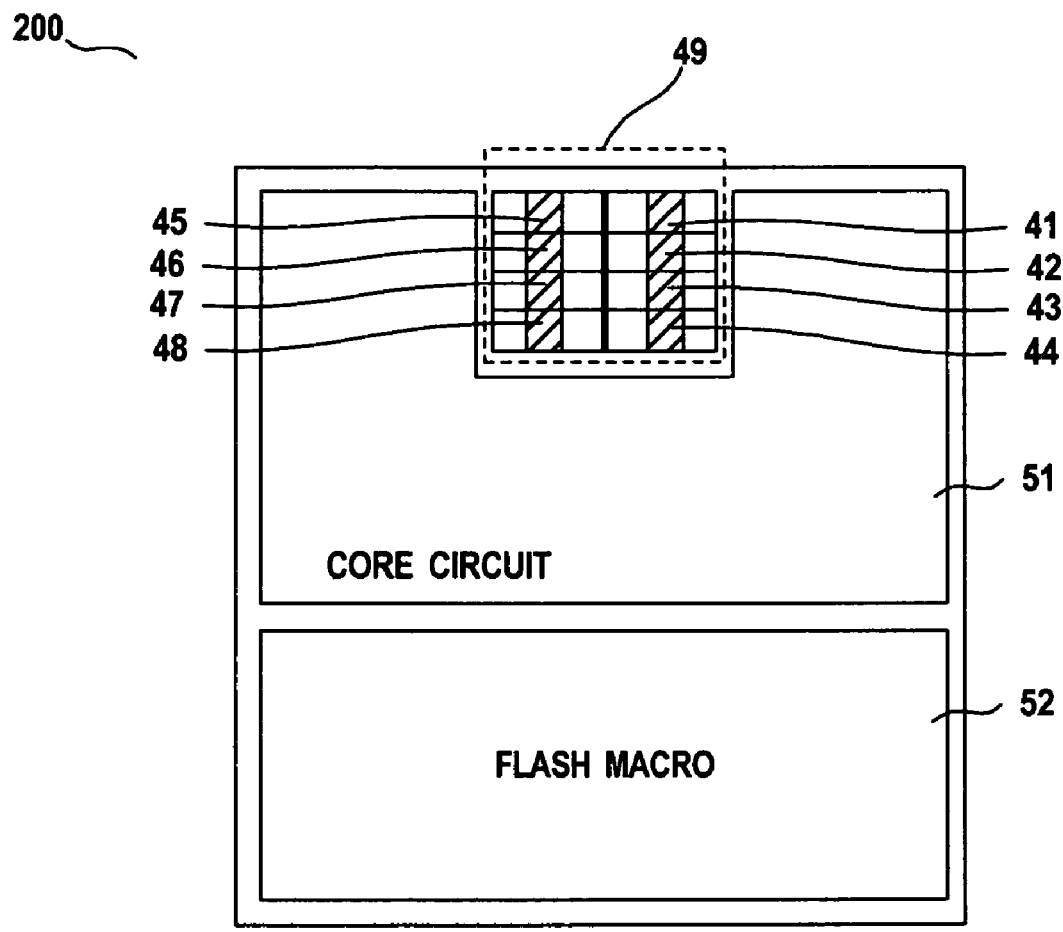
FIG. 2 is a simplified layout diagram for the placement of input/output pads for a smart card chip in accordance with one embodiment of the present invention.

FIG. 2 is a simplified layout diagram for the placement of input/output pads for a smart card chip in accordance with one embodiment of the present invention. Referring to FIG. 2, a layout of the input/output pads 41 to 48 of a smart card chip 200 is shown. Compared to the traditional placement, the two columns 29 and 30 (see FIG. 1B) are placed immediately next to each other, making up a cluster 49. The shape of a core circuit 51 is modified, so that it now partly surrounds the cluster 49 (and the input/output pads 41 to 48). The chip 200 also includes a memory device 52. All the input/output pads 41 to 48 are further grouped within a contiguous area of the cluster 49.

Figure 3:
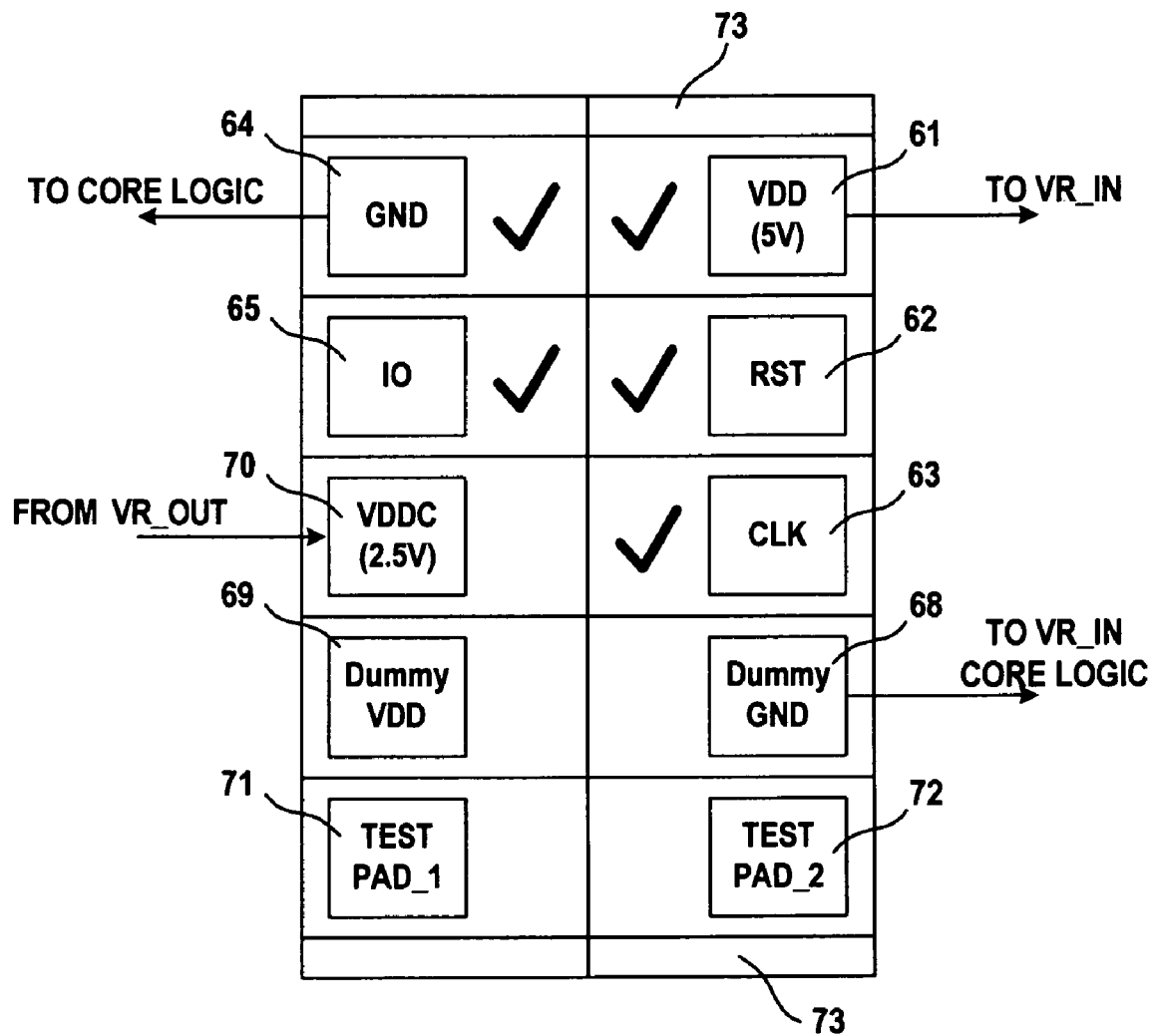
FIG. 3 is an enlarged layout diagram for the placement of input/output pads for a smart card chip in accordance with another embodiment of the present invention.

FIG. 3 is an enlarged layout diagram for the placement of input/output pads for a smart card chip in accordance with another embodiment of the present invention. A cluster 300 includes a pad 61 for power (VDD), a pad 62 for resetting the chip, a pad 63 for reading the chip's clock signal, a pad 64 for ground (GND), and a pad 65 for serial data communication with the chip. However, compared to the cluster 49 in FIG. 2, the cluster 60 additionally comprises a dummy ground pad 68, a dummy power (VDD) pad 69, a pad for an input from a voltage regulator 70 and test pads 71 and 72. A cluster edge cell 73 comprises a VDD/GND guard-ring structure for latch-up prevention.

As shown in FIG. 3, the pads 61 and 64 for power and ground respectively are placed back-to-back. The dummy ground pad 68 and the dummy power pad 69 are added to improve ESD protection performance, such that the pads 62, 63 and 65 are surrounded by VDD/GND and dummy VDD/GND pads.

Figure 4:
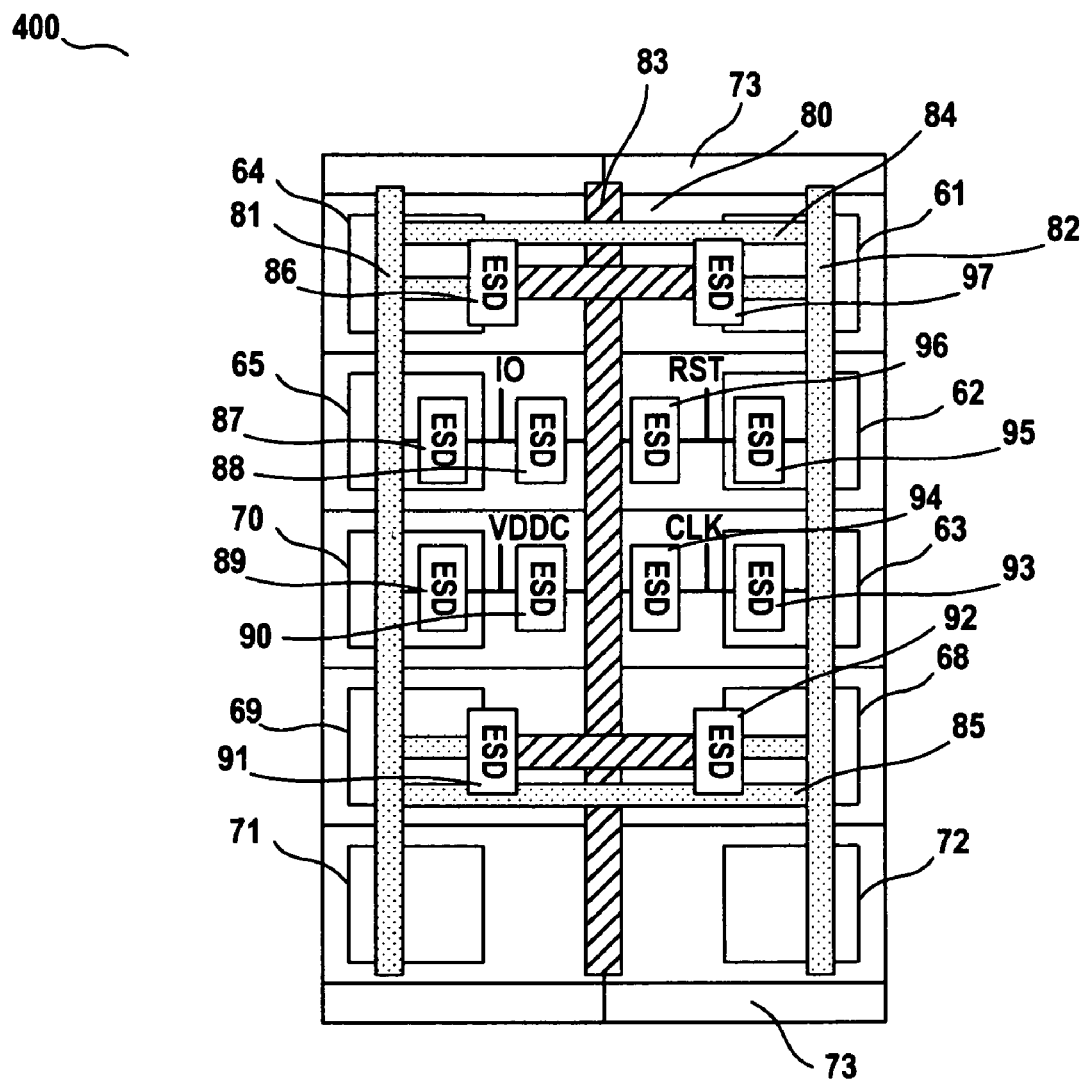
FIG. 4 is a simplified layout diagram illustrating the placement of input/output pads for a smart card chip and an ESD network in accordance with yet another embodiment of the present invention.

FIG. 4 is a simplified layout diagram illustrating the placement of input/output pads for a smart card chip and an ESD network in accordance with another embodiment of the present invention. FIG. 4 shows a layout view 400 of the placement of the input/output pads for the smart card chip in FIG. 3 and also an ESD network 80. The ESD network 80 comprises VDD buses 81 and 82 and GND bus 83 as major ESD buses. The VDD buses 81 and 82 are connected to each other via buses 84 and 85. The IESD network 80 also comprises a plurality of ESD protection devices 86 to 97 (such as SCRS) connected among the pads 61 to 68 and the respective VDD buses 81, 82 and the GND bus 83 to protect each input/output from any accidental ESD, for example, when a user accidentally touches one of the contact points of the smart card.

It is understood that a first group of bond pads comprising bond pads 64 and 65, as well as a second group of bond pads comprising the bond pads 61, 62 and 63, are surrounded at their two sides by the ESD metal buses (GND). The ESD metal bus (VDD) connections between the second group of bond pads and the first group of bond pads are through VDD/GND and dummy VDD/GND back-to-back abutting and edge cell. Such design provides, compared to prior art, a shortened all-level ESD path to conduct the charges to the ground. A person skilled in the art would appreciate that the shorter the VDD and GND buses are, the lower the resistance and the quicker the discharging becomes.

The present invention eliminates the need for cross-chip VDD/GND bus connections and hence greatly reduces the chip size (about three to five percent chip size reduction in customer chips), while still providing excellent ESD performance. The invention further provides better ESD protection performance due to reduction of VDD and GND bus resistance, and has no restrictions on cluster placement on the chip. Furthermore, the present invention allows easy integration with an on-chip voltage regulator (VR) by providing an additional dummy ground pad and other power pads as illustrated in FIG. 3.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A chip for a smart card including a plurality of electrical contacts for communication of data with a smart card reader, said chip comprising:
   a core circuit;
   a plurality of input/output pads corresponding to the electrical contacts, wherein said input/output pads including a power supply pad and a ground pad are divided into at least a first column and a second column placed immediately adjacent to the first column, such that the first and second columns form a cluster, wherein the cluster further comprises at least one or more edge cells having a guard-ring structure to prevent latch-up; and
   an electrostatic discharge network including at least one VDD bus coupled to the power supply pad and at least one GND bus coupled to the ground pad, such that the VDD bus and the GND bus are placed substantially parallel to the first and second columns, and
   wherein the at least one VDD bus is placed on each side of the cluster and the GND bus is placed between the first and second columns, and each of the input/output pads is coupled to the at least one GND bus or to the at least one VDD bus through an electrostatic discharge unit, thereby providing a shortened ESD discharge path.

2. The chip of claim 1, wherein the first or second column has at least four input/output pads.

3. The chip of claim 1, wherein the cluster is partially surrounded by three neighboring sides of the core circuit.

4. The chip of claim 1 further comprising a nonvolatile memory device.

5. The chip of claim 1, wherein the input/output pads further include a serial data communication pad, a clock signal pad, and a resetting pad.

6. The chip of claim 5, wherein the input/output pads further comprise a dummy power supply pad and a dummy ground pad, wherein the dummy power supply and ground pads are additional power supply and ground pads configured to improve electrostatic discharge performance.

7. The chip of claim 6, wherein the input/output pads are so placed in the cluster that the serial data communication pad, the clock signal pad, and the resetting pad are partly enclosed by the power supply pad, the dummy power supply pad, the ground pad and the dummy ground pad.

8. The chip of claim 1, wherein the guard-ring structure is a VDD/GND guard ring structure for latch-up prevention.

9. A method for placing input/output pads for a smartcard chip including a core circuit and a plurality of input/output pads for communication of data with a smart card reader, the method comprising:
   grouping the plurality of input/output pads including a power supply pad and a ground pad into at least a first column and a second column, with each column having an equal number of input/output pads;
   placing the first column and the second column immediately adjacent to each other to form a cluster within the core circuit, wherein the cluster further comprises at least one or more edge cells having a guard-ring structure to prevent latch-up; and
   placing an electrostatic discharge network including at least one VDD bus coupled to the power supply pad and at least one GND bus coupled to the ground pad, such that the VDD bus and the GND bus are placed substantially parallel to the first and second columns, and
   wherein the at least one VDD bus is placed on each side of the cluster and the GND bus is placed between the first and second columns, and each of the input/output pads is coupled to the at least one GND bus or to the at least one VDD bus through an electrostatic discharge unit, thereby providing a shortened ESD discharge path.

10. The method of claim 9, wherein the cluster is partially surrounded by at least three neighboring sides of the core circuit.

11. The method of claim 9, wherein the first column comprises at least a ground pad and a serial data communication pad.

12. The method of claim 11, wherein the second column comprises at least a power pad, a resetting pad, and a clock signal pad.

13. The method of claim 12, wherein the ground pad and the power pad are placed immediately next to each other to reduce overhead power and ground bus routing areas and improve ESD performance by reducing power and ground bus resistance.

14. The method of claim 12, wherein the cluster further comprises a dummy ground pad and a dummy power pad, wherein the dummy power and ground pads are additional power and ground pads configured to improve electrostatic discharge performance.

15. The method of claim 14, wherein the input/output pads are so placed in the cluster that the serial data communication pad, the resetting pad, and the clock signal pad are partly enclosed by the power supply pad, the dummy power supply pad, the ground pad, and the dummy ground pad.

16. The method of claim 9, wherein the cluster further comprises at least one or more test pads and a pad for an input from a voltage regulator, allowing easy integration with an on-chip voltage regulator.

* * * * *